United States Patent [19]

Foerg

[11] Patent Number: 5,235,531
[45] Date of Patent: Aug. 10, 1993

[54] METHOD AND ARRANGEMENT FOR DIVIDING THE FREQUENCY OF AN ALTERNATING VOLTAGE WITH A NON-WHOLE-NUMBERED DIVISION FACTOR

[75] Inventor: Pirmin-Nikolaus Foerg, Grafing, Fed. Rep. of Germany

[73] Assignee: Siemens Aktiengesellschaft, Munich, Fed. Rep. of Germany

[21] Appl. No.: 806,353

[22] Filed: Dec. 13, 1991

[30] Foreign Application Priority Data

Dec. 17, 1990 [EP] European Pat. Off. ............ 90124443

[51] Int. Cl.$^5$ .............................................. H03L 7/18
[52] U.S. Cl. ........................................ 364/703; 377/48
[58] Field of Search ............................ 364/703; 377/48

[56] References Cited

U.S. PATENT DOCUMENTS

| | | | |
|---|---|---|---|
| 4,053,739 | 10/1977 | Miller | 364/703 |
| 4,494,243 | 1/1985 | Elmis | 377/48 |
| 4,559,613 | 12/1985 | Murphy et al. | 364/703 |
| 4,837,721 | 6/1984 | Carmichael et al. | 364/703 |
| 4,891,774 | 1/1990 | Bradley | 364/703 |
| 5,088,057 | 2/1992 | Amrany et al. | 364/703 |

FOREIGN PATENT DOCUMENTS 0373768 6/1990 European Pat. Off. .

OTHER PUBLICATIONS

SP8000 Series High Speed Dividers Integrated Circuit Handbook, Nov., 1981, Dr. Pirmin N. Foerg, pp. 140-143.
IEEE Journal of Solid-State Circuits, vol. 24, No. 2, Apr., 1989, "A 14-bit 80-kHz Sigma-Delta A/D Converter: Modeling, Design, and Performance Evaluation", by Steven R. Norsworthy et al., pp. 256-266.
Übertragungstechnik, "Die neue synchrone digitale Hierarchie" ntz No. 41, 1988, Wolfgang Ehrlich et al., pp. 570-574.

Primary Examiner—David H. Malzahn
Attorney, Agent, or Firm—Hill, Steadman & Simpson

[57] ABSTRACT

In a synchronous data network such as a synchronous digital hierarchy, frequency generators in every network node must be followed up by synchronous signals having, for example, a frequency of 2.048 or 1.544 MHz, and which are derived from a common frequency normal. A divider having a non-whole-numbered division factor that can also be utilized elsewhere is lacking for this. Over and above this, the possibility of correcting conditioned frequency errors by positive/zero/negative pulse stuffing is also lacking. The former is enabled by an arrangement comprising a divider 23 that is periodically switched between two auxiliary division factors (m, n). The latter is allowed by an arrangement wherein the positive (PST) and negative (NST) pulse stuffing signals proceed partly directly and partly delayed to a decoder and, via this decoder, to an accumulator. Addresses generated by the latter cause a memory pair for forward x-values and y-values defined dependent on the pulse stuffing signals via a multiplexer to a further accumulator whose carry signal drives the divider for the purpose of frequency correction.

14 Claims, 5 Drawing Sheets

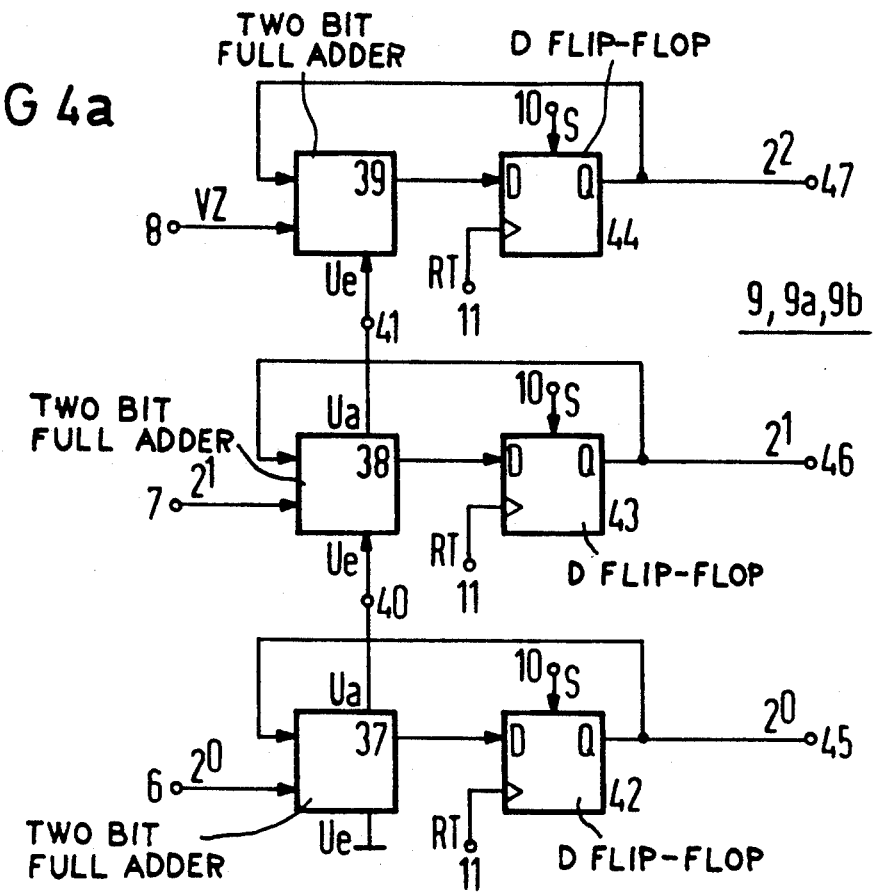

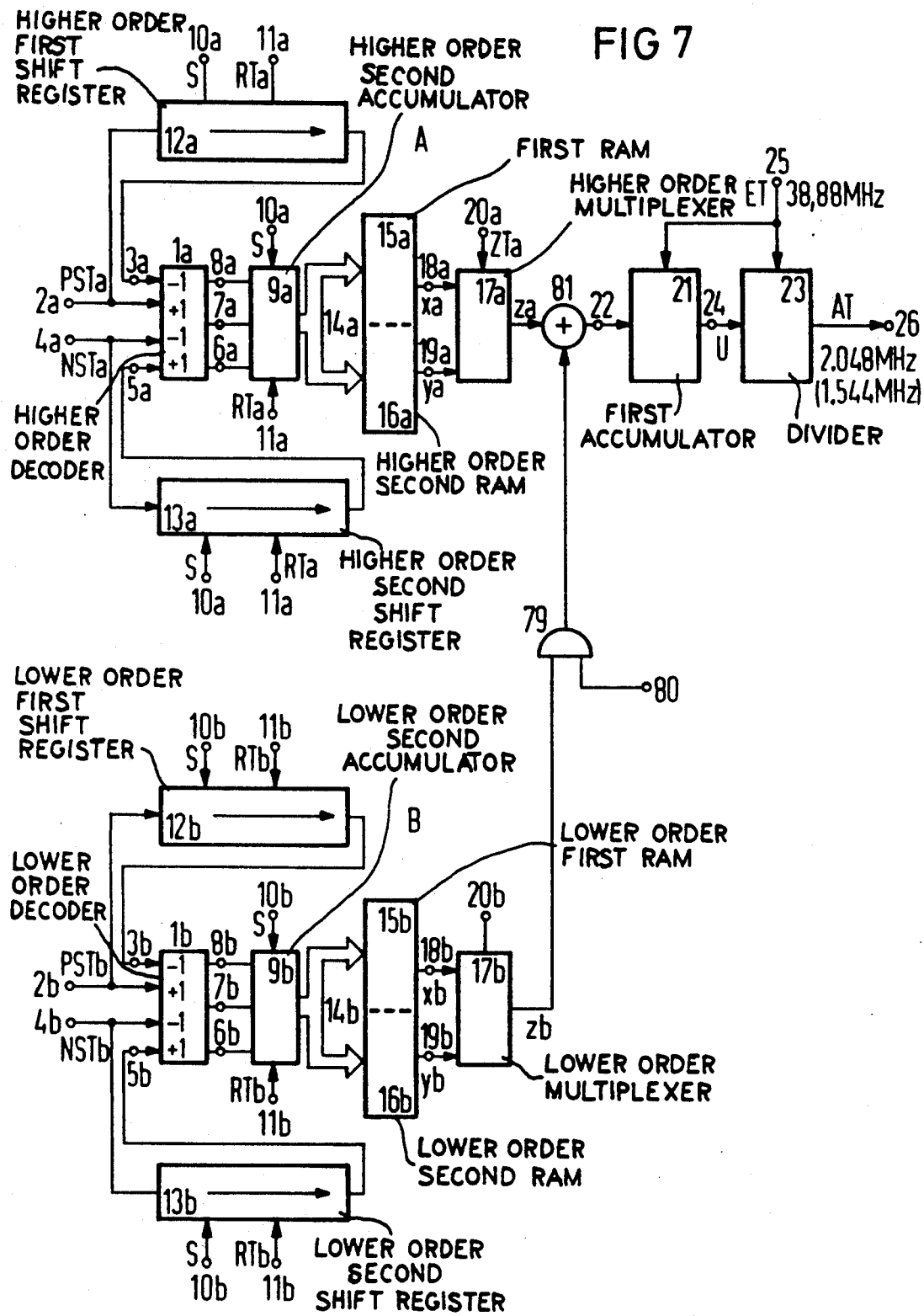

METHOD AND ARRANGEMENT FOR DIVIDING THE FREQUENCY OF AN ALTERNATING VOLTAGE WITH A NON-WHOLE-NUMBERED DIVISION FACTOR

BACKGROUND OF THE INVENTION

The invention is directed to a method for dividing the frequency of an alternating voltage with a non-whole-numbered division factor into a second frequency upon alternating generation of a first cycle group having a first periodicity by division with a first, whole-numbered, auxiliary division factor whose value lies above that of the division factor, and of a second cycle group having a second periodicity by division with a second, whole-numbered, auxiliary division factor whose value lies below that of the division factor.

Such a method is known for a switchable divider (dual modulus divider) that is presented in the "SP8000 Series High Speed Dividers Integrated Circuit Handbook", The Plessey Company plc, Nov. 1981, publication No. P.S. 1937, pages 140-143, incorporated herein.

The periodical, "IEEE Journal of Solid-State Circuits", April 1989, Vol. 24, No. 2, pages 256-266, incorporated herein, describes a sigma-delta modulation. In this type of modulation, amplitude values are integrated in the clock. When a threshold is reached, a pulse is output and the integrator is reset. The pulse repetition rate depends on the size of the individual amplitude value.

The periodical "ntz", 41 (1988) No. 10, pages 570-574, incorporated herein, describes a synchronous digital hierarchy SDH having a basic bit rate of 155.52 Mbit/s when signals both from the European as well as from the North American plesiochronic digital hierarchy PDH are transmitted in pulse frames called transport modules.

FIG. 1 of the present application shows a multiplex structure of the synchronous digital hierarchy SDH. AU means administrative unit, AUG means administrative unit group, C means container, STM means synchronous transport module, TU means tributary unit, TUG means tributary unit group, and VC means virtual container. The attached numbers or pairs of numbers n indicate the position in the multiplex structure. A is a region of higher order, B is a region of lower order.

Plesiochronic signals to be transmitted are periodically inserted into the container C-n during multiplexing with the assistance of positive pulse stuffing. Each of these containers is supplemented by the addition of a path overhead to form a virtual container VC-n. The chronological position of the first bytes thereof in the frame of a STM-N signal (N=1, 2, 4, 8, 12, 16) or of a virtual container of a higher hierarchy level is indicated by a pointer. A virtual container VC-11, VC-12, VC-2 or VC-3 can form a tributary unit TU-n together with the pointer allocated to it. A plurality of these having the same structure can in turn be combined to form a tributary unit group TUG-n that in turn has space in a virtual container VC-3 or VC-4. The latter is inserted into an administrative unit AU-3 or AU-4 that can be combined to form an administrative unit group AUG together with an administrative unit pointer. This administrative unit group AUG forms a STM-1 signal together with the section overhead. A plurality of these STM-1 signals form a STM-N signal. The method steps proceed in the opposite direction during demultiplexing. The numbers at the lines indicate how many times the frame parts are transmitted together.

No frequency-compensating stuffing procedures should be required in a synchronously operating network. Since, however, greater phase shifts due to fluctuations in cable running time given longer cable links must be avoided, and since, moreover, frequency deviations given losses of synchronization as well as given transitions to other networks must be compensated, the pointers have a further job.

It is not only a phase difference between virtual container and STM frame that is taken into consideration with the pointer; rather, frequency differences between a STM-N input and output signal or, respectively, network node clock, can also be compensated therewith on the basis of a positive/zero/negative pulse stuffing. For that purpose, the pointer is composed of a H1, or of a H2 and a H3 byte. The first two contain the actual pointer which indicates the position of the first byte of the virtual container and contains a stuffing information, and the H3 byte can be an information byte in frequency compensation procedures.

In the case of a frequency offset between the STM frame clock and the frame clock of the virtual container, the pointer must be occasionally modified, whereby either a positive or a negative stuffing byte or three thereof as well are provided in the STM frame for frequency compensation dependent on the position in the multiplex structure.

When the frame clock of the virtual container is too slow in comparison to the STM frame clock, then the start of the virtual container must be offset to a later time in chronological intervals within the frame. In such a compensation procedure, one or, respectively, three, dummy bytes are inserted into the useful information block following the section overhead, and the pointer is incremented (positive pulse stuffing) by a value step, whereby this contains a skip over three bytes.

When the frame clock of the virtual container is too fast in comparison to the STM-N frame clock, then the start of the virtual container must be offset to an earlier time within the STM frame. In such a compensation procedure, the pointer value is deincremented by a value step and one or three additional information bytes must be additionally transmitted (negative pulse stuffing). This is inserted into the one or into the three H3 bytes of the pointer—the pointer action byte.

In addition to containing the actual pointer value, the first two pointer bytes contain the information as to whether stuffing was carried out positively, zero, or negatively.

Given a cross-connect means wherein virtual containers of the types VC-11, VC-12, VC-2 or VC-3 (in the region of the lower order B) are through-connected and combined at the output side to form STM-N signals, positive/zero/negative pulse stuffing must be carried out herein and in a virtual container such as VC-3 (in the region of higher order A) or VC-4 wherein the through-connected virtual container was accommodated.

In a network of the synchronous digital hierarchy SDH, a synchronous clock pulse must be available at every network node, this synchronous clock pulse being synchronous with the network node to which the frequency normal is allocated.

The synchronous clock pulse could be distributed over a separate line network. However, it could also be derived from the clock frequency of the synchronous transport modules deriving from the network node having the frequency normal. This, however, is not exactly possible when a network node in the feeder link remains in the hold-over mode and generates its clock itself. An earlier proposal (German application P 40 33 557.7, incorporated herein) therefore proposes that the clock of a virtual container which is contained in a STM-N signal that arrives proceeding from the network node having the frequency normal is employed as a synchronizing signal. The clock frequency is derived from that of the frequency normal, and has the same frequency stability as the frequency normal.

SUMMARY OF THE INVENTION

It is an object of the invention to specify a method and an arrangement for dividing the frequency of an alternating voltage with a non-whole-numbered division factor. In particular, a frequency of 2.048 or 1.544 MHz should be acquired from the clock of a STM-1 signal having a frequency of 155.52 MHz.

According to a method of the invention for dividing a frequency $f_1$ an alternating voltage by a non-whole-numbered division factor into a second frequency $f_2$, alternatingly generating a first period group having a periodicity a by division with a first, whole-numbered auxiliary division factor m whose value lies above that of the non-whole-numbered division factor. Also alternatingly generating a second period group having periodicity b by division with a second, whole-numbered auxiliary division factor n whose value lies below that of the division factor. The periods of the alternating voltage having the frequency $f_1$ are allocated to a frame. Selecting $am+bn=v$ and $(a+b)/f_2=v/f_1$. A switching between the period groups is effected by a signal having a fixed value z, that is sigma-delta modulated.

In order to be able to realize the circuit in CMOS technology, We do not proceed on the basis of the frequency 155.52 MHz of the STM-1 signal, but on the basis of one-fourth of this frequency, namely 38.88 MHz. This frequency yields a jitter that is lower by a factor of two than if one were to proceed on the byte clock frequency of 19.44 MHz.

BRIEF DESCRIPTION OF THE DRAWINGS

FIG. 4a shows the second accumulator in FIG. 2 in detail;

FIG. 4b shows an arithmetic strategy with respect to the second accumulator;

FIG. 7 shows a fundamental circuit diagram of the invention for positive/zero/negative stuffing both in the region A as well as in the region B in the multiplex structure of FIG. 1.

DESCRIPTION OF THE PREFERRED EMBODIMENTS

Figure 2:
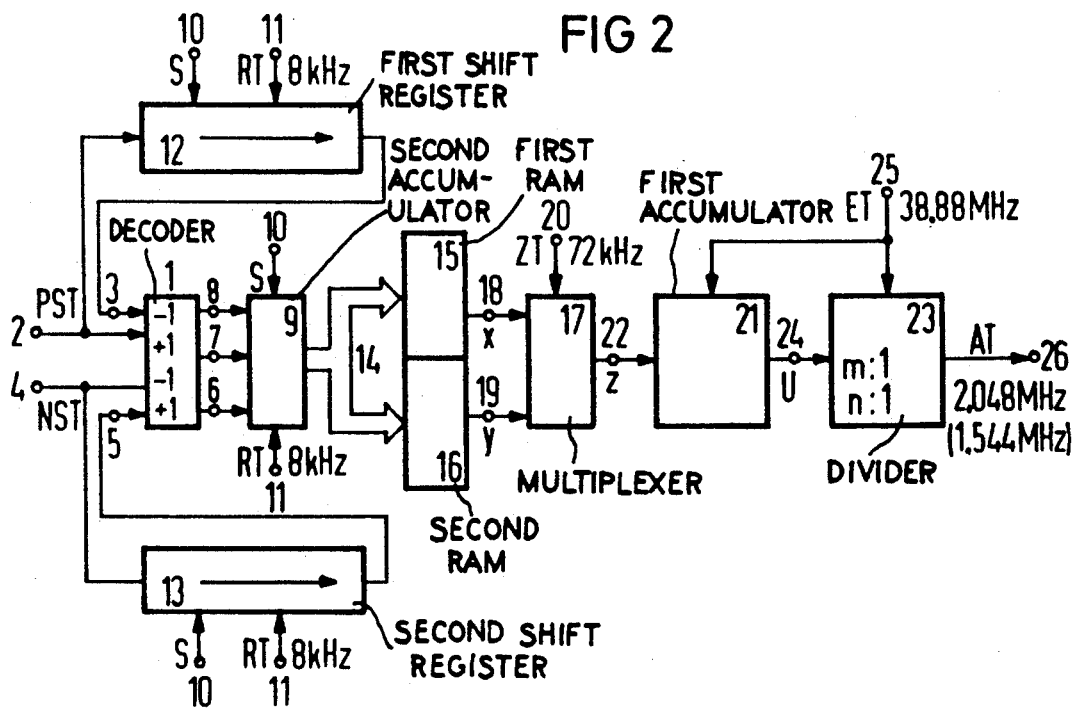
FIG. 2 shows a fundamental circuit diagram of the invention for positive/zero/negative pulse stuffing in a region.

FIG. 2 shows the fundamental circuit diagram of the arrangement of the invention for positive/zero/negative pulse stuffing in the region A. The arrangement contains a decoder 1, accumulators 9 and 21, shift registers 12 and 13, random access memories (RAM) 15 and 16, a multiplexer 17, and a switchable divider 23.

An input clock ET having a frequency of 38.88 MHz is supplied to the switchable divider 23 (18/19:1 for 2.048 MHz and 25/26:1 MHz for 1.544 MHz) via an input 25. An output clock having a frequency of 2.048 MHz or 1.544 MHz is taken therefrom via an output 26. Stuffing signals PST for positive pulse stuffing and NST for negative pulse stuffing of a STM-1 signal serve the purpose of correcting the frequency of the output clock AT. What is thereby involved is the administrative unit pointer AU-4 PTR or AU-3 PTR. The positive pulse stuffing signals PST are forwarded onto the input 2 and, via the shift register 12, onto the input 3 of the decoder 1; the negative pulse stuffing signals NST are forwarded onto the input 4 and, via the shift register 13, onto the input 5 of the decoder 1.

The two shift registers 12 and 13 have a length of 4L. This factor indicates the number of STM-1 frames over which the phase modification necessary due to the pointer action is distributed. The factor 4 thereby results from the demand that a pointer action dare occur only every fourth frame. When no pointer activities are present, the shift registers 12 and 13 are empty. Logical statuses "1" at the inputs 3 and/or 4 respectively require a subtraction of 1 or 2, and logical statuses "1" at the input 2 respectively require an addition of 1 or 2. In addition to supplying a value of zero, the decoder 1 supplies positive values 1 and 2 or negative values 1 and 2 in two's complement via its outputs 6 and 7, and supplies the operational sign VZ via its output 8. The accumulator 9 converts these values into seven addresses that proceed via the bus 14 to the memories 15 and 16 and read pairs composed of an x-value and of a y-value. The x-value and the y-value are defined from the relationships $$\frac{2 * 9(c * x_1 + d * y_1)}{TA} = C1 - C2$$

for positive pulse stuffing, $$\frac{2 * 9(c * x_2 + d * y_2)}{TA} = C1$$

for negative pulse stuffing and $$\frac{2 * 9(c * x_3 + d * y_3)}{TA} = C1 + C2$$

for negative pulse stuffing, whereby

TA is a plurality of clocks having the frequency $f_1$ for generating a carry pulse;

C1 is a plurality of required transmission pulses;

C2=C/4L is a plurality of required, additional transmission pulses or transmission pulses to be omitted that dismantle a phase skip; and wherein c=6 given skips of pointers AU-4 PTR, AU-3 PTR and TU-3 PTR, c=42 given a skip of a pointer TU-2 PTR, c=126 given a skip of a pointer TU-12 PTR, c=168 given a skip of a pointer TU-11 PTR, and L=1, 2, 3, . . . for a plurality of super frames composed of four frames over which a phase modification is distributed.

Controlled by the line row clock ZT, these x and y values are interleaved in the multiplexer 17 such that the output signal is composed of 269 x values and of one y value. Controlled by the input clock ET, this is added in the accumulator 21. Carry signals U control the switching of the auxiliary division factors m and n in the divider 23.

Figure 3A:
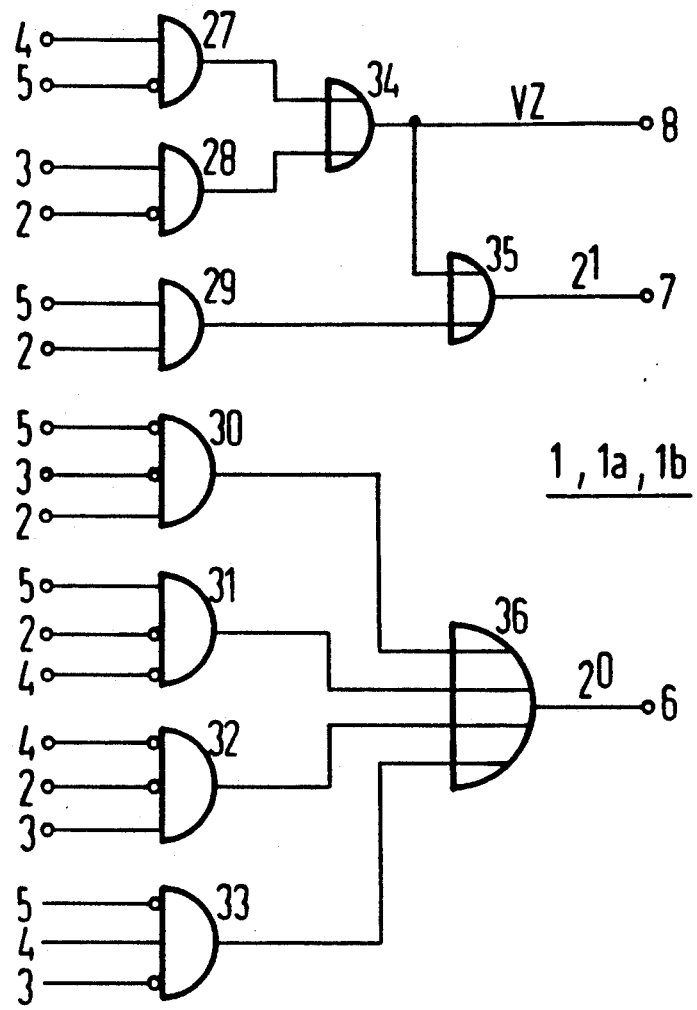
FIG. 3a shows the decoder of FIG. 2 in detail.
Figure 3B:
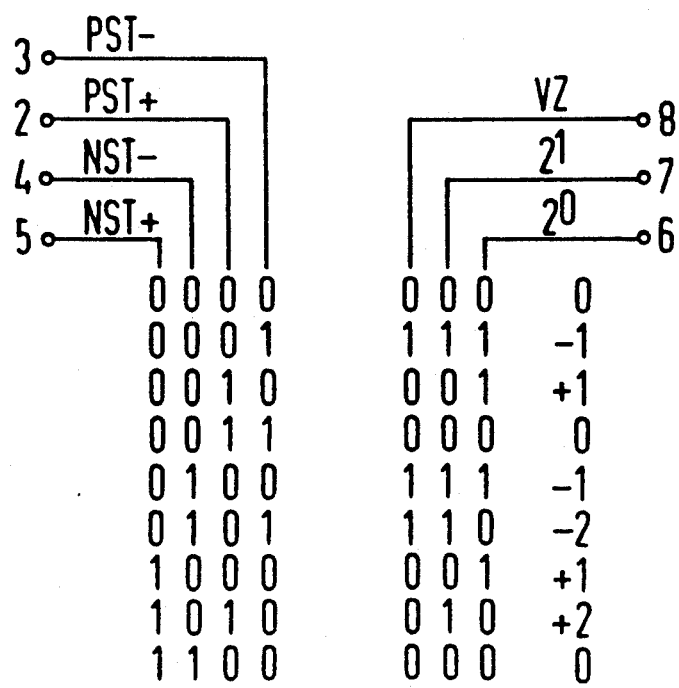
FIG. 3b shows a value table related to the decoder.

FIG. 3a shows the decoder 1 composed of a gate circuit and comprising AND gates 27-33 having partially inverting inputs and of OR gates 34-36. FIG. 3b shows the decoded values binarily and decimally for all possible instances.

FIG. 4a shows the accumulator 9 of FIG. 2. It works as a $\pm 1$ or $\pm 2$ counter. When the polarity is taken into consideration, then six counter readings and the value zero derive, i.e. a total of seven addresses for the read-only memories 15 and 16.

The arrangement is composed of three accumulator elements each of which is respectively composed of a 2-bit full adder 37, 38 or 39 and of a D-flipflop 42, 43 or 44.

Logical statuses shall be referred to in brief below as "1" and "0".

As a result of a setting pulse S at the setting input 10, all outputs 45 through 47 are brought to "0" at the start. When the input 6 is now lent the status "1", then the 2-bit full adder 37 adds the "1" at the input 6 to the "0" at the output 45. Since the carry input Ue also lies at "0", a "1" appears at the output of the 2-bit full adder 37, this "1" being forwarded with the next frame clock RT at the clock input 11 to the Q-output of the D-flipflop 42. Since no "1" is present at the inputs 7 and 8 and at the respective carry signal inputs Ue, the outputs 46 and 47 remain at "0". A "0" appears at the input 6 at the next frame clock RT. full adder 37 again outputs a "1" to the D-flipflop 42. This "1" is forwarded to the output 45 at the next frame clock RT.

When stuffing is now carried out again, then a "1" again arrives at the input 6 and the 2-bit full adder 37 must add "1" twice. The result is that a "0" appears at its output and a "1" appears at the carry signal output Ua, this being forwarded via the carry signal line 40. A "0" is now present at both inputs at the 2-bit full adder 38, and the "1" is present at the carry signal input Ue. A "1" appears at the output of the 2-bit full adder 38 and this "1" is forwarded to the output 46 at the next frame clock RT.

Given positive pulse stuffing PST at the input 2 of the decoder, it can occur that the correction for a negative pulse stuffing NST that lies chronologically in the past arrives at the same time via the shift register 13. The same is true given negative pulse stuffing NST and correction of a positive pulse stuffing EST that lies chronologically in the past via the shift register 12. The accumulator 9 must then respectively count two steps.

FIG. 4b shows a numerical example for the accumulator 9 of FIG. 4a. The upper half thereof shows the logical statuses at the decoder outputs 6 through 8 for a positive pulse stuffing signal PST, for the reaction RPST to the positive pulse stuffing signal PST via the shift register 12, for a negative pulse stuffing signal NST, and for the reaction RNST to the negative pulse stuffing signal NST via the shift register 13. The numerical values for every fourth, three-place code word are entered therebelow. The lower half of this figure shows the logical statuses at the outputs 45 through 47. Three arrows demonstrate the addition. At the left-hand arrow group, $-1$ at the input of the accumulator 9 is added to $+2$ at the output of the accumulator 9 and the result $+1$ appears. At the right-hand arrow group, $-1$ is added to $-1$, and $-2$ derives.

Figure 5:
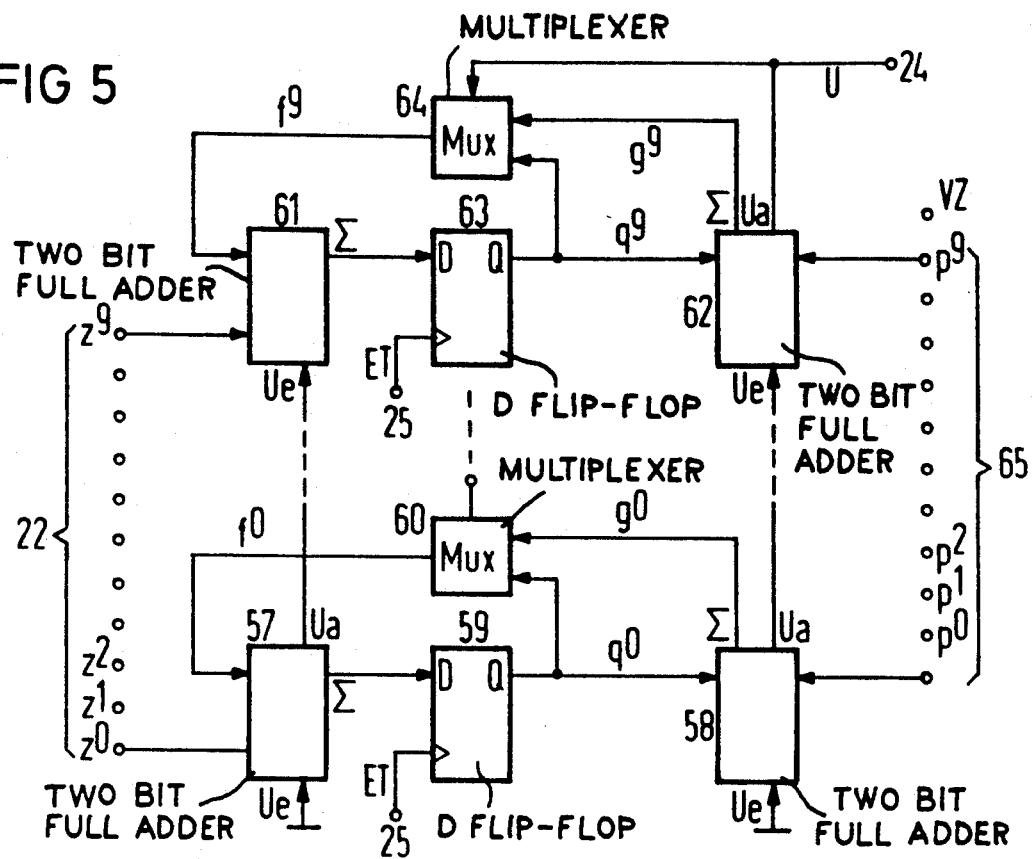
FIG. 5 shows the first accumulator in FIG. 2 in detail.

FIG. 5 shows the accumulator 21 of FIG. 2. It contains ten accumulator elements whereof the first contains 2-bit full adders 57 and 58, a D-flipflop 59 and a multiplexer 60, and wherein the second contains two 2-bit full adders 61 and 62, a D-flipflop 63, and a multiplexer 64. The accumulator elements herein are more involved than in FIG. 4a, since the accumulator depth is 576, and thus not a power of two. Here, the accumulator depth must always be a multiple of three since phase skips from 3 * 8 bits must be compensated. The value 576 was selected with 9 * $2^6$.

The number q at the left-hand inputs of the ten 2-bit full adders 58, 62 is compared to the number p=576 in two's complement that is permanently present at the input 65. The carry signal U at the terminal 24 indicates whether the number q is greater than or less than the number p.

When $q \geq p$, then U logical "1" applies. When, by contrast, $q < p$, then U=logical "0" applies and the accumulator 21 has not yet reached the value of 576. When U="0", then the ten multiplexers 60, 64 apply the number q to the upper inputs of the ten 2-bit full adders 57, 61 as number f. When, by contrast, U="1", then the ten multiplexers 60, 64 allow the number $g = q - p$ through to the upper inputs of the ten 2-bit full adders 57, 61 as number f. When a number z is now applied to the inputs 22, then the sub-accumulator having the ten 2-bit full adders 57, 61 and the ten D-flipflops 59, 63 act like the accumulator 9 of FIG. 4a. The carry signal U is forwarded to the divider 23 via the terminal 24.

Figure 6:
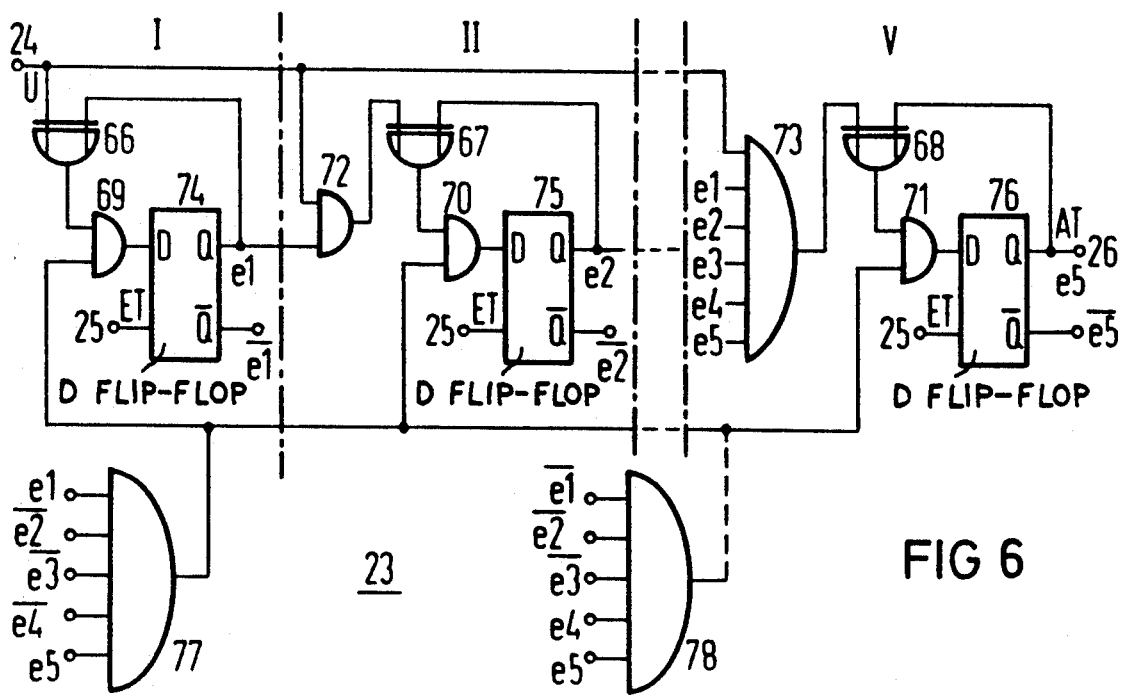
FIG. 6 shows the divider in FIG. 2 in detail.

FIG. 6 shows the divider 23 of FIG. 2. The arrangement contains exclusive-OR gates 66 through 68, AND gates 69 through 73, D-flipflops 74 through 76 and NAND gates 77 or 78. The NAND gate 77 is required for an output clock AT of 2.048 MHz, and the NAND gate 78 is required for an output clock AT of 1.544 MHz. The arrangement thus contains either the NAND gate 77 or the NAND gate 78.

An exemplary embodiment comprising the NAND gate 77 shall be set forth below.

Every stage I through V is a synchronous 1-bit divider circuit. An output signal "0" of the NAND gate 77 causes e1 through e5 to assume the status "0" with the input clock ET. The output signal of the NAND gate 77 should now be "1". A status "0" at the terminal 24 acts as an enable signal for the divider stages I through V. When a carry pulse U appears at the input 24, then the output of the exclusive-OR gate 66 and of the AND gate 69 assumes the status "1". e1 becomes "1" with the next input clock ET. A "1" is thus present at both inputs of the exclusive-OR gate 66. The output thereof and the output of the AND gate 69, and thus the D-input of the D-flipflop 74, thus assume the status "0". This status is forwarded to e1 with the input clock ET. A status "0" at the terminal 24 provides a further triggering. All following stages can only trigger when the respective Q-outputs of all D-flipflops of the preceding stages and the carry pulse U are logical "1". The AND gates 72 and 73 effect this. The divider 23 works as a synchronous counter.

Resetting must be carried out at 17 given the divider 18/19:1, and resetting must be carried out at 24 given the divider 25/26:1. It is thus taken into consideration that zero is also a number. The number 17 is calculated with the NAND gate 77. e1 ="1" and e5="1" yield 17 when e2, e3, and e4="0". The number 24 is calculated with the NAND gate 78. e4="1" and e5="1" are 24 when e1, e2 and e3="0".

When the number 17 or 24 is reached, the logical status at the output of the NAND gates 77 or 78 changes to "0" and the divider 23 is reset. It thus now divides by 18 or 25. When the carry pulse U that comes from the accumulator 21 changes to "0", then the divider 23 stands still for exactly one clock. Since the accumulator 21 and the divider 23 are controlled with the same input clock ET, the carry pulse U changes to "1" at the next input clock ET and the counter 23 is re-activated.

The arrest of the divider 23 for one clock denotes a division of the input clock ET by 19 or by 26.

Figure 1:
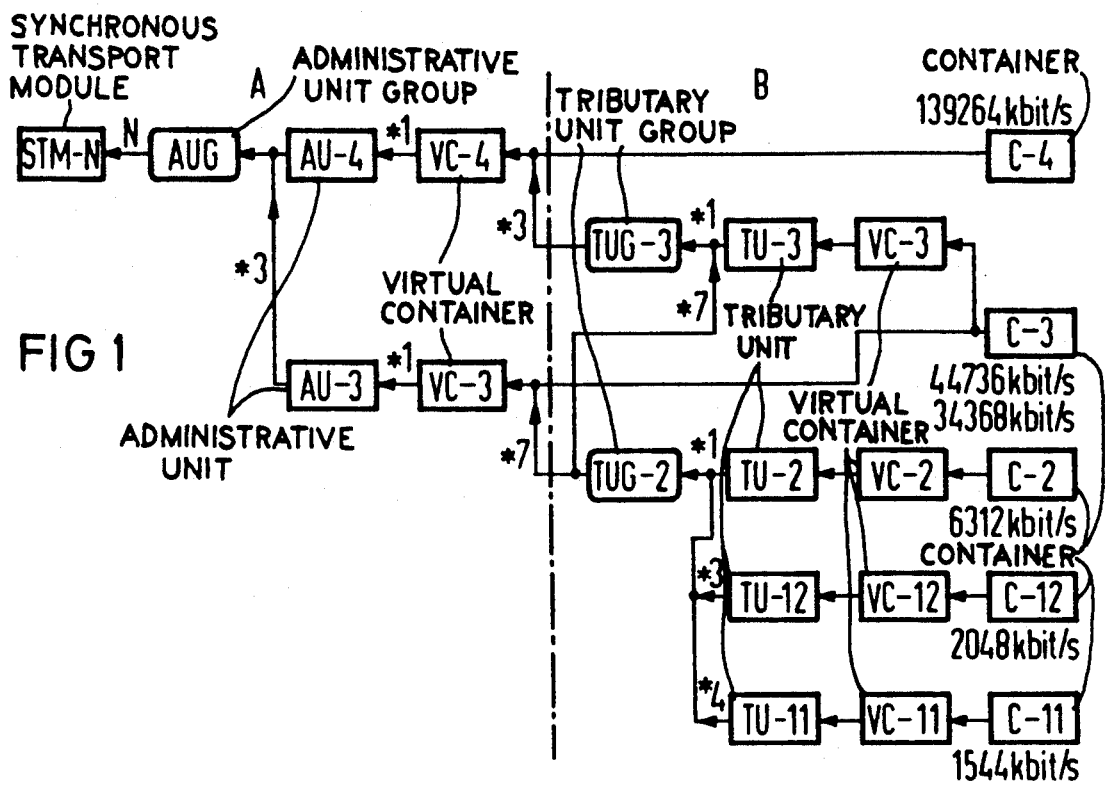
FIG. 1, as already set forth, shows a multiplex structure of the synchronous digital hierarchy.

FIG. 7 shows an arrangement of the invention that processes pulse stuffing signals PSTa and NSTa from the upper region A, and pulse stuffing signals PSTb and NSTb from the lower region B of the multiplex structure of FIG. 1. The elements 1a through 20a and 1b through 20b are identical in circuit-oriented terms. However, a frame clock RTa of the STM-1 signal and the line clock ZTa thereof are applied in the region A, whereas a frame clock RTb of a virtual container VC-4 or VC-3, and a line clock ZTb of these virtual containers, is applied in the region B. The values stored in the read-only memories 15a and 16a or 15b and 16b are different. The output signals of the multiplexers 17a and 17b, namely za and zb, are added in an adder 81 and are supplied to the accumulator 21 and divider 23 known from FIG. 2. The feed of the output signal zb can be interrupted by the AND gate 79 when a signal that indicates the presence of the virtual container VC-4 or VC-3 taking the stuffing bytes into consideration is applied to the input 80 thereof.

Although various minor changes and modifications might be proposed by those skilled in the art, it will be understood that I wish to include within the claims of the patent warranted hereon all such changes and modifications as reasonably come within my contribution to the art.

I claim as my invention:

1. In method for generating an output clock having a frequency $f_2$ by division of an input clock having a frequency $f_1$ with a non-even-numbered division factor and which is allocated to data transmitted in a pulse frame, and wherein a first period group is generated having a period a by division with a first, whole-numbered auxiliary division factor m whose value lies above that of the non-even-numbered division factor, and wherein a second period group is generated having a period number b by division with a second, whole-numbered auxiliary division factor n whose value lies below that of the non-even-numbered division factor, the generation of the first and second period groups being alternated between the two groups, the improvement comprising the steps of:

supplying received positive stuffing signals and negative stuffing signals together with their corresponding delayed compensation signals as input signals to a decoder which allocates different output signals to said input signals, said positive and negative stuffing signals correcting a frequency of the output clock;

accumulating said output signals in an accumulator which converts them into addresses which are used to read out from a memory x and y values;

interleaving the x and y values which are supplied to a further accumulator and which outputs carry signals;

utilizing said carry signals to control switching of the auxiliary division of actor m and n in a divider; and allocating v periods of the input clock having the frequency $f_1$ to a pulse frame and selecting $am+bn=v$ and $(a+b)/f_2=v/f_1$.

2. A method according to claim 1 wherein said output signal z is accumulated in said further accumulator with every clock pulse having the frequency $f_1$ up to an overflow value, said carry signals comprising a carry pulse being output when said overflow value is reached and before a re-start of the accumulation.

3. A method according to claim 1 wherein the frequency $f_1=f_0/4=38.88$ MHz from a clock frequency $f_0$ of STM-1 signal having a frame of 9*270 octets lasting 125 μs and with positive/zero/negative pulse stuffing; the output signal z being approximated by values x urging c octets and values y during d octets given $c+d=270$ for pointer actions in a higher order region A and $c=d=261$ for pointer actions in a lower order region B; and providing different values of x and y from the relationships $$\frac{2 * 9(c * x_1 + d * y_1)}{TA} = C1 - C2$$

for positive pulse stuffing, $$\frac{2 * 9(C * x_2 + d * y_2)}{TA} = C1$$

for negative pulse stuffing, and $$\frac{2 * 9(c * x_3 + d * y_3)}{TA} = C1 + C2$$

for negative pulse stuffing, whereby

TA is a plurality of clocks having the frequency $f_1$ for generating a carry pulse;

C1 is a plurality of required transmission pulses;

$C2=C/4L$ is a plurality of required, additional transmission pulses or transmission pulses to be omitted that dismantle a phase skip; and wherein $C=6$ given skips of pointers AU-4 PTR, AU-3 PTR and TU-3 PTR, $C=42$ given a skip of a pointer TU-2 PTR, $C=126$ given a skip of a pointer TU-12 PTR, $C=168$ given a skip of a pointer TU-11 PTR, and $L=1, 2, 3, \ldots$ for a plurality of super frames composed of four frames over which a phase modification is distributed.

4. A method according to claim 3 for dividing the frequency $f_1=38.88$ MHz into a frequency $f_2=2.048$ MHz, wherein $z=4860$, $m=19$, $n=18$, $a=252$, $b=4$, $c=269$, $d=1$, $TA=576$, $C1=252$, $C2=0.5$, $x_1=29$, $Y_1=247$, $x_2=29$, $y_2=263$, $x_3=30$, and $y_3=10$ is selected.

5. A method according to claim 3 for dividing the frequency $f_1=38.88$ MHz into a frequency $f_2=1.544$ MHz, wherein $z=4860$, $m=26$, $n=25$, $a=35$, $b=158$, $c=269$, $d=1$, $TA=576$, $C1=35$, $C2=0.5$, $x_1=4$, $y_1=28$, $x_2=4$, $y_2=44$, $x_3=4$, and $y_3=60$ are selected.

6. A method according to claim 3 wherein $TA=3*2^o$ is selected, whereby o is a whole number.

7. A method according to claim 3 wherein respectively different values x and y are selected given skips of the pointers AU-4 PTR or AU-3 PTR, or the pointers TU-3 PTR, TU-2 PTR, TU-12 PTR or TU-11 PTR.

8. In method for generating an output clock having a frequency $f_2$ by division of an input clock having a frequency $f_1$ with a non-even-numbered division factor and which is allocated to data transmitted in a pulse frame, and wherein a first period group is generated having a period a by division with a first, whole-numbered auxiliary division factor m whose value lies above that of the non-even-numbered division factor, and wherein a second period group is generated having a period number b by division with a second, whole-numbered auxiliary division factor n whose value lies below that of the non-even-numbered division factor, the generation of the first and second period groups being alternated between the two groups, the improvement comprising the steps of:

supplying received positive stuffing signals and negative stuffing signals together with their corresponding delayed compensation signals as input signals to a decoder which allocates the different output signals to said input signals, said positive and negative stuffing signals correcting a frequency of the output clock;

accumulating said output signals and converting them into partial accumulation values which are in turn sigma-delta modulated by accumulation;

undertaking a switching between division ratios m/n of a divider when a fixed value is reached; and allocating v periods of the input clock having the frequency $f_1$ to a pulse frame and selecting $am+bn=v$ and $(a+b)/f_2=v/f_1$.

9. In a system for generating an output clock having a frequency $f_2$ by division of an input clock having a frequency $f_1$ with a non-even-numbered division factor and which is allocated to data transmitted in a pulse frame, and wherein a first period group is generated having a period a by division with a first, whole-numbered auxiliary division factor m whose value lies above that of the non-even-numbered division factor, and wherein a second period group is generated having a period number b by division with a second, whole numbered auxiliary division factor n whose value lies below that of the non-even-numbered division factor, the generation of the first and second period groups being alternated between the two groups, wherein the improvement comprises:

a decoder means receiving as input signal positive stuffing signals and negative stuffing signals together with their corresponding delayed compensation signals, said decoder means allocating different output signals to said input signals, said positive and negative stuffing signals corresponding a frequency of the output clock;

accumulator means for accumulating said output signals and for converting them into addresses which are sued to read out from a connected memory x and y values;

multiplexer means for interleaving the x andy values to form an output z signal formed of a plurality of x values and a y value which are supplied to a further accumulator means for outputting carry signals; and a divider means connected to receive said carry signals, said carry signals controlling switching of the auxiliary division factors m and n in said divider means.

10. An arrangement according to claim 9 wherein a divider switchable via a control input between said two auxiliary division factors m and n is provided, and the switching means has an output connected to the control input of the divider.

11. An arrangement according to claim 10 wherein said further accumulator means is clocked by the frequency $f_1$ for adding said output value z with every clock period to a value that is already reached, and for outputting a carry pulse as said carry signals upon overflow and for resetting itself.

12. An arrangement according to claim 11 further including: said memory means comprising first and second memories; means for writing a value $x_1$, $x_2$, $x_3$ into cells of the first memory and values $y_1, y_2, y_3$ into cells of the second memory; and said multiplexer means comprising a multiplexer controlled by a line clock having a frequency of 72 kHz, a first input thereof for 269 octets being connected to an output of the first memory, a second input thereof for one octet being connected to an output of the second memory, and an output thereof being connected to a control input of said further accumulator means.

13. An arrangement according to claim 12, further comprising: said accumulator means being controlled by a frame clock having a frequency of 8 kHz; said decoder means incrementing one step given a positive pulse stuffings signal at a first input and deincrementing one step given a negative capsule stuffing signal at a second input; a first shift register means controlled by said frame clock and having 4L stages, and for deincrementing by one step said accumulator means in delayed fashion given a positive pulse stuffing signal at a third input; and a second shift register means controlled by said frame clock and having 4L stages, and for incrementing by one step said second accumulator means in delayed fashion given a negative pulse stuffing signal at a fourth input, where L indicates a plurality of four-fold super frames wherein a pointer action is allowed to occur.

14. An arrangement according to claim 13 wherein additional decoder means, additional first and second register means, additional accumulator means, additional first and second memories, and an additional multiplexer are provided; said additional first and second shift register means and said additional accumulator means being controlled by a second frame clock and said additional multiplexer means being controlled by a second lien clock; outputs of both of said multiplexer means and said additional multiplexer means being connected via an adder to a control input of said further accumulator means; and an AND gate whose first input is connected to an output of said additional multiplexer means, and whose second input serves for reception of a virtual container and stuffing byte presence signal and whose output is connected to a corresponding input of the adder.

* * * * *